United States Patent [19]

Ayasli

[11] Patent Number: 4,543,535

[45] Date of Patent: Sep. 24, 1985

[54] DISTRIBUTED POWER AMPLIFIER

[75] Inventor: Yalcin Ayasli, Lexington, Mass.

[73] Assignee: Raytheon Company, Lexington, Mass.

[21] Appl. No.: 600,871

[22] Filed: Apr. 16, 1984

[51] Int. Cl.$^4$ .............................................. H03F 3/60
[52] U.S. Cl. ..................................... 330/53; 330/286; 330/277
[58] Field of Search .................. 330/53, 54, 277, 286; 333/126–128

[56] References Cited

U.S. PATENT DOCUMENTS

| | | | |
|---|---|---|---|
| 3,097,343 | 7/1963 | Sosin et al. | 330/306 |
| 4,291,286 | 9/1981 | Wagner | 333/166 |
| 4,311,966 | 1/1984 | Bert et al. | 330/286 |

FOREIGN PATENT DOCUMENTS 1205087 11/1968 United Kingdom .................. 330/54

OTHER PUBLICATIONS

"Archive for Electronics and Communications" by Uwe Christ, vol. 27, (1973), pp. 448–450.
"Microstrips on Semiconductor Materials" by Heinz Storck, Jul. 2, 1971.
"Power MOS FET Amplifier with Subnanosecond Response Time" by V. P. D'Yakonov & V. Yu. Smerdov.
Instrum. & Exp. Tech. (USA), vol. 23, No. 3, Pt. 2, (May–Jun. 1980), (Publ. Dec. 1980).
"0–5 W 2–21 GHz Monolithic GaAs Distributed Amplifier by B. Kim and H. Q. Tserng.
Electronics Letters, 3/29/1984, vol. 20, No. 7.
"A Traveling-Wave Transistor" by George W. McIver, Proceedings of the IEEE, Nov. 1965, pp. 1747–1748.

*Primary Examiner*—James B. Mullins
*Assistant Examiner*—G. Wan
*Attorney, Agent, or Firm*—Denis G. Maloney; Joseph D. Pannone

[57] ABSTRACT

A distributed power amplifier includes a plurality of field effect transistors (FETS), each one of such FETS having gate, drain and source electrodes, such FETS having cascaded gate electrodes and cascaded drain electrodes successively coupled between an input terminal and an output terminal. The gate electrode of each one of the successively coupled FETS is coupled to the input terminal through a corresponding one of a plurality of capacitors, and a common bias source through one of a corresponding plurality of high impedance bias paths. Since the gate electrodes of each FET are coupled to the input terminal through a capacitor, the coupling capacitor in combination with the inherent capacitance of each FET provides a potential divider into each gate electrode. Therefore, the power fed to each gate electrode is selected by selecting the value of capacitance for the coupling capacitors. In an alternate embodiment, a pair of sets of such capacitively coupled FETS is provided with the drain electrodes of each set of such FETS being coupled to a common output r.f. transmission line.

21 Claims, 8 Drawing Figures

DISTRIBUTED POWER AMPLIFIER

BACKGROUND OF THE INVENTION

This invention relates generally to radio frequency amplifiers and more particularly to radio frequency amplifiers having a plurality of cascade coupled field effect transistors arranged to provide a distributed amplifier.

As is known in the art, radio frequency amplifiers configured as distributed amplifiers having a plurality of cascade interconnected field effect transistors have been suggested to provide amplification of radio frequency signals. One problem associated with such type of amplifiers is that in certain applications, the output power of the distributed amplifier is limited over a selected band of operating microwave frequencies.

SUMMARY OF THE INVENTION

In accordance with the present invention, a distributed amplifier includes a plurality of transistors, preferably field effect transistors, each one of such field effect transistors having gate, drain and source electrodes and a reactive component between the gate and source electrodes. The plurality of field effect transistors having cascade interconnected gate electrodes and cascade interconnected drain electrodes is successively coupled between an input terminal and an output terminal. An input line is provided to successively couple an input signal to each one of said gate electrodes. A like plurality of capacitors, each having a predetermined capacitance are coupled between the input line and the gate electrode of each transistor.

As described in my copending U.S. patent application Ser. No. 484,087 filed Apr. 11, 1983 and assigned to the same assignee as the present invention, and incorporated herein by reference, the output power of the distributed amplifier may be considered as being limited by three constraints.

The first constraint is related to the finite r.f. voltage swing which can be provided to an input gate line without clipping the voltage waveform. This r.f. voltage swing is limited on the positive r.f. cycle by the forward conduction of the gate of each of the field effect transistors, and on the negative cycle by the pinch-off voltage of each of the field effect transistors. Thus, the maximum power from any distributed power amplifier cannot be larger than the maximum gain times the maximum permissible input power which is primarily determined by the maximum voltage swing.

The second constraint on output power in prior art distributed amplifiers is the maximum total gate periphery that can be provided in single stage design for use over a particular range of operating frequencies. It may be shown that the total gate periphery nw is related to an operating frequency $\omega_o$ as follows: $nw \leq K/(\omega_o^2 Z_o)$ where n is the total number of field effect transistors, w is the gate periphery of one of such field effect transistors, K is a constant dependent upon field effect transistor characteristics, $\omega_o$ is the highest operating frequency and $Z_o$ is the characteristic impedance of the gate line. Thus, for a particular gate line characteristic impedance and for a particular range of operating frequencies, the maximum gate periphery is limited. This occurs because as the total gate periphery nw of the prior art design increases, the loading on the gate line increases concomitant therewith thereby reducing the input power available to any one of such field effect transistors and reducing the output power provided to the output terminal from the drain electrodes of each one of the FETS.

The third constraint on output power is related to mismatch between the actual output impedance of each one of the field effect transistors, and an optimum output impedance of such field effect transistors biased for maximum output power. The actual output impedance of each field effect transistor is predetermined by the characteristic impedance of the output transmission line, whereas, the optimum output impedance of an FET biased for maximum output power is the slope characteristic of a load line which would intersect the maximum breakdown voltage and maximum operating current. Typically, an FET biased for maximum output power has an optimum output impedance much higher than that of the output transmission line.

With such an arrangement, a potential r.f. voltage divider is provided by the combination of each coupling capacitor and the associated reactive component of the field effect transistor. The potential divider reduces the voltage which is fed to each one of the gate electrodes of the field effect transistors thereby increasing the overall input power handling capability of the input circuit of the amplifier. Therefore, the total input power fed to the distributed amplifier can be increased in accordance with the decrease in the input voltage signal provided to each one of the gate electrodes. Thus, such an arrangement provides a solution to the problem presented by the limit on maximum input power to an FET. Since the input voltage signal to each individual FET is reduced, the total device periphery of each device should increase accordingly to maintain the same gain for each field effect transistor. With the arrangement provided, since each FET is provided an input voltage signal determined by the potential divider which is a portion of the input voltage signal fed to the input of the distributed amplifier, the total device periphery may be increased without increasing the loading on the gate line. Since the total gate periphery is increased, the drain periphery of each FET is increased and thus the optimum output impedance for an FET biased from maximum output power is reduced correspondingly bringing the value of such optimum output impedance closer to the actual output impedance of each FET.

In accordance with a further aspect of the present invention, each one of such capacitors has a different predetermined capacitance which is selected in accordance with the reactive component of the field effect transistor to provide a different predetermined portion of the input signal to each one of said gate electrodes. With this arrangement, the input signal excitation to each one of the field effect transistors is selectively tailored in accordance with the characteristics of the field effect transistor and the losses associated with the gate transmission line, thereby providing uniform input signal excitation to each one of the transistors which in addition to providing increased input power handling capability to each one of the transistors also provides increased amplifier gain, improved efficiency, and makes input impedance matching easier. Thus, increased output power from each one of said field effect transistors is provided with increased gain and efficiency, and thus also increased output power from the distributed amplifier is also provided.

In accordance with a further aspect of the present invention, by providing the plurality of coupling capacitors, a bias voltage signal is coupled directly to each gate electrode through a resistor having a relatively high resistance. With this arrangement, the complex biasing arrangement generally associated with prior designs is eliminated by providing separate radio frequency and d.c. bias paths to each gate electrode.

In accordance with an alternate embodiment of the present invention, a distributed amplifier includes a plurality of transistors, preferably field effect transistors, each one of such field effect transistors having gate, drain and source electrodes. A first set or portion of such field effect transistors having cascade gate electrodes and cascade drain electrodes is successively coupled between an input terminal and an output terminal to provide a first channel, and a second set or like portion of such field effect transistors having cascade gate electrodes and cascade drain electrodes is likewise successively coupled between the input terminal and the output terminal to provide a second channel. The gate electrodes of each field effect transistor of each set of field effect transistors are coupled to a corresponding one of a pair of gate transmission lines through a corresponding capacitor. The drain electrode of each one of the field effect transistors is interconnected by a common drain output transmission line, with the drain electrode of each field effect transistor of the first channel being coupled at a common junction along such output transmission line to the drain electrode of a corresponding one of each field effect transistor of the second channel. With such an arrangement, the maximum output power of such a distributed amplifier is increased in relation to the maximum output power available from a distributed amplifier including a single set of such field effect transistors successively coupled between an input terminal and an output terminal.

With the arrangement provided above, by connecting a first portion of field effect transistors between an input terminal and an output terminal and a second like portion of field effect transistors between said input terminal and output terminal, the input power to each portion of the field effect transistors is equal to one-half the input power to the distributed amplifier. Therefore, using the same design considerations as in a single channel amplifier, the total input power to the distributed amplifier here can be doubled, providing equal amounts of input power to each portion of FETS as in the single channel case. Therefore, such an arrangement overcomes the problem presented by the limit on the maximum input power to an FET. Further, by coupling each gate electrode to the respective gate transmission line through a capacitor having a selected capacitance, the input excitation to each field effect transistor is related to the capacitance of the coupling capacitor divided by the sum of the capacitance of the coupling capacitor and intrinsic reactance of the FET. Therefore, the input signal provided to each FET is also tailored to permit a further increase in input power handling capability. In addition, the arrangement also overcomes the problem presented by the limitation on total gate periphery since each portion of such FETS are provided in separate branches of the gate line, with a common drain line connecting drain electrodes of each one of such FETS to the output terminal. The gate periphery of each one of the transistors is increased accordingly as in the single channel design without an increase in gate line loading. Thus, each drain line has a further increase in the amount of gate periphery available to provide a concomitant increase in output power. Further, since pairs of drain electrodes of corresponding FETS are coupled to a common drain line at corresponding common junctions, and further still, since the gate periphery of each FET is increased, the total effective drain periphery of each FET is increased, and thus the optimum output impedance for an FET biased for maximum output power is reduced by a factor related to the total increase in drain periphery bringing the value of such optimum output impedance closer to the actual output impedance for each FET.

In accordance with a further aspect of this embodiment, the value of capacitance of each capacitor is selected to provide uniform excitation to each gate electrode of each FET thus providing an increase in gain for the distributed amplifier, as in the single channel case.

In accordance with a further aspect of the embodiment, separate r.f. and bias paths are provided to bias each gate electrode as in the single channel case.

BRIEF DESCRIPTION OF THE DRAWINGS

The foregoing features of the invention, as well as the invention itself, may be more fully understood from the following detailed description of the drawings, in which.

DESCRIPTION OF THE PREFERRED EMBODIMENTS

Figure 1:
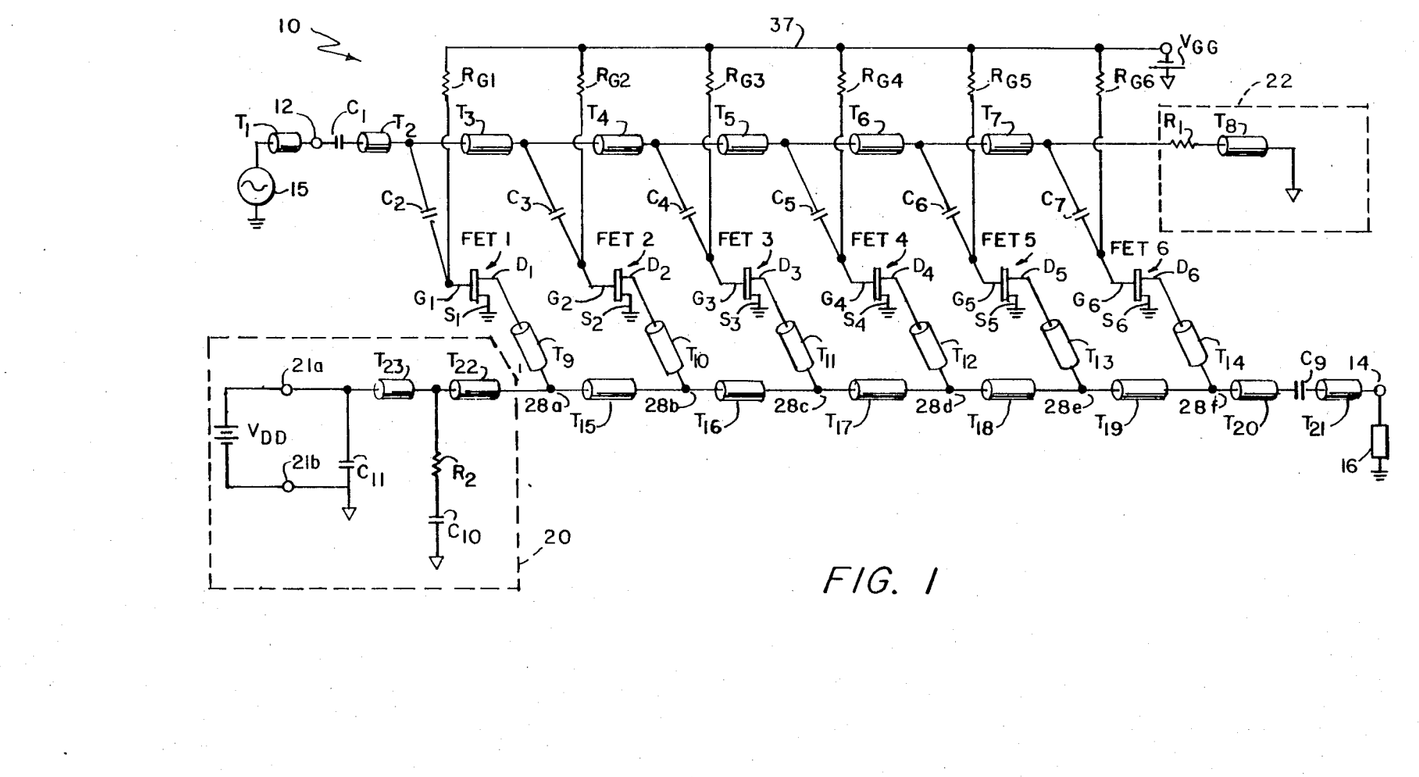
FIG. 1 is a schematic diagram of a distributed amplifier having a plurality of transistors cascade interconnected between an input terminal and an output terminal in accordance with an embodiment of the present invention.

Referring now to FIG. 1, a distributed power amplifier 10 is shown to include a plurality of field effect transistors, here FET 1–FET 6 which are cascade interconnected between an input terminal 12 and an output terminal 14 and which provide amplification of radio frequency signals fed to the input terminal 12 from a signal source 15 via transmission line $T_1$, here a microstrip transmission line having a predetermined characteristic impedance $Z_o$ and a DC blocking capacitor $C_{10}$, such amplified radio frequency signals appearing at the output terminal 14 and being fed to a load 16.

The field effect transistors FET 1–FET 6 are here metal electrode semiconductor field effect transistors (MESFET). The field effect transistors FET 1–FET 6 have input electrodes, here gate electrodes $G_1$–$G_6$, respectively, cascade electrically interconnected via transmission lines $T_2$–$T_7$, here microstrip transmission lines, and capacitors $C_2$-$C_7$, respectively, as shown. The output electrodes, here drain electrodes $D_1$-$D_6$ of such field effect transistors FET 1-FET 6, respectively, are cascade electrically interconnected via transmission lines $T_9$-$T_{14}$ and $T_{15}$-$T_{20}$, here microstrip transmission lines, as shown. Source electrodes $S_1$-$S_6$ of the transistors FET 1-FET 6, respectively, are coupled to a reference potential, here ground, through a common r.f. and DC electrical path, as shown. The gate electrode of the first one of the field effect transistors FET 1, here gate electrode $G_1$ of FET 1 is coupled to a transmission line, here microstrip transmission line $T_2$. Transmission line $T_2$ is capacitively coupled to input terminal 12 via capacitor $C_1$ and thus to signal source 15. The output electrode, i.e., drain electrode $D_1$ of the first field effect transistor FET 1 is coupled to a drain DC bias circuit 20 via transmission line $T_9$, as shown. A succeeding one of the field effect transistors, here the last or sixth field effect transistor, FET 6, has input or gate electrode $G_6$ coupled to a gate transmission line termination circuit 22, as shown. The output or drain electrode $D_6$ of such transistor FET 6 is connected to the output terminal 14, via transmission line $T_{14}$, serially connected transmission line $T_{20}$, DC blocking capacitor $C_9$ and serially connected transmission line $T_{21}$. Here such transmission line $T_{21}$ is also a microstrip transmission line.

It is noted that the electrical pathlengths between the input terminal 12 and the output terminal 14 through each one of the field effect transistors FET 1-FET 6 are substantially equal. That is, the capacitance of coupling capacitors $C_2$-$C_7$, the electrical lengths of the transmission line sections $T_3$-$T_7$, $T_9$-$T_{14}$ and $T_{15}$-$T_{19}$ used to interconnect the field effect transistors FET 1-FET 6, and the phase or delay characteristics of FET 1-FET 6 are selected in combination to provide such equal electrical pathlengths.

The drain bias circuit 20 is here a ladder network having two shunt pads to ground, via capacitors $C_{10}$ and $C_{11}$, with the transmission lines, here microstrip transmission lines $T_{22}$ and $T_{23}$ as series elements of such ladder network. Input terminals 21a, 21b are adapted for coupling to a drain electrode DC bias source, such as $V_{DD}$, as shown. Capacitors $C_{10}$ and $C_{11}$ provide low impedance shunt pads for radio frequency signals to ground to prevent such radio frequency signals from being coupled to the DC bias source $V_{DD}$ thereby isolating the DC bias source VDD from such radio frequency signals. A direct current path is provided through transmission lines $T_{22}$ and $T_{23}$ and thus direct current from drain bias source $V_{DD}$ is allowed to pass from terminal 21a through the strip conductors of microstrip transmission lines $T_{22}$ and $T_{23}$ of such bias circuit 20 and then to the drain electrodes $D_1$ to $D_6$ by means of the strip conductors of transmission lines $T_9$-$T_{14}$ and $T_{15}$-$T_{19}$, and then return to ground through the grounded source electrodes $S_1$-$S_6$, respectively. It is also noted that the shunt path which includes the capacitor $C_{10}$ also includes a serially connected resistor $R_2$. It is to be noted, however, that the direct current path is not provided to ground through resistor $R_2$ and hence no direct current power is dissipated by resistor $R_2$.

The gate line termination circuit 22 includes serially connected resistor $R_1$ and transmission line $T_8$, here a microstrip transmission line, as shown. Gate bias is provided to each gate electrode $G_1$-$G_6$ via resistors $R_{G1}$-$R_{G6}$ which are electrically connected to a common bias line 37 which in turn is coupled to a bias source $V_{GG}$, as shown. Capacitors $C_2$-$C_7$ provide d.c. blocking capacitors for the bias voltage, thus no bias voltage is coupled to transmission lines $T_2$-$T_7$.

In operation, an r.f. input signal from r.f. source 15 is fed to input terminal 12 via transmission line $T_1$ and is coupled through capacitor $C_1$ and to each one of such transmission lines $T_2$ to $T_7$ and therefore is coupled to corresponding ones of such coupling capacitors $C_2$-$C_7$ and thus to corresponding gate electrodes $G_1$-$G_6$ of FET 1-FET 6 which are biased to provide gain to such signals. The amplified signal from FET 1 is coupled from drain $D_1$ to transmission line $T_9$ and is fed to a junction 28a and propagates along transmission lines $T_{15}$-$T_{19}$ to junction 28f. The amplified signal from FET 2 is coupled to transmission line $T_{10}$ and to a junction 28b and propagates along transmission lines $T_{16}$-$T_{19}$ and is combined in phase at junction 28f with the previous signal coupled from FET 1. Similarly, succeeding ones of such transistors FET 3-FET 6 each feed an amplified radio frequency signal to a succeeding one of said junctions 28c-28f and each one of said signals are combined in phase at junction 28f with the signals fed from previous ones of said FETS. The total composite signal is then coupled to the output terminal 14.

The input signal from radio frequency source 15 is coupled to gate electrodes $G_1$-$G_6$ through capacitors $C_2$-$C_7$ and transmission lines $T_2$-$T_7$. Capacitors $C_2$-$C_7$ in combination with intrinsic or inherent input capacitance provided between gate and source electrodes of each one of such FETS, FET 1-FET 6 provide a potential or voltage divider to such r.f. energy. With this arrangement, since only a portion of the input voltage signal is provided to excite the gate electrode of each FET, the total input voltage and hence the input power to the amplifier 10 can be increased accordingly. Thus, when each capacitor $C_2$-$C_7$ has a capacitance equal to the intrinsic capacitance of each FET, a symmetric divider is provided and the voltage across the gate electrode will be ½ of the input voltage. Therefore, the input voltage can be doubled, and concomitant therewith, the input power handling capability of the distributed amplifier may be increased by a factor of four. To maintain the same gain per stage, the gate periphery of each device is increased by a factor related to the voltage divider ratio. Thus, for the example above, the gate periphery is also increased by a factor of two. This is accomplished without any additional loading on the gate line due to the presence of the capacitive voltage divider. Increasing the gate periphery increases the total device r.f. output periphery of each FET bringing the optimum d.c. loadline output impedance of each FET closer to the actual output drain line impedance.

Preferably, the value of capacitance for each one of such capacitors $C_2$-$C_7$ is selected to provide a predetermined excitation of each one of the FETS, FET 1-FET 6, and therefore, the amount of input power delivered to each one of the FETS is thus optimized to provide a uniform amount of input power to each FET. With this arrangement, the value of capacitance for each capacitor $C_2$-$C_7$ is selected in accordance with the fixed inherent capacitance $C_{GS1}$-$C_{GS6}$ (FIG. 2) of each FET such that each FET is fed a uniform input signal, and a predetermined, different tailored portion of the input signal on the gate lines $T_2$-$T_7$ is thus selectively sampled by each FET. In this manner, the input power to amplifier 10 can be significantly increased and the total gate periphery can be increased, as above, and also the gain of the amplifier can be increased. Therefore, it is believed that input power can be increased typically by a factor of four and total device periphery can be increased by a factor of 2, and since each device is uniformly excited, the amplifier provides increased gain and efficiency without having the input signal saturate any one of the FETS.

Figure 2:
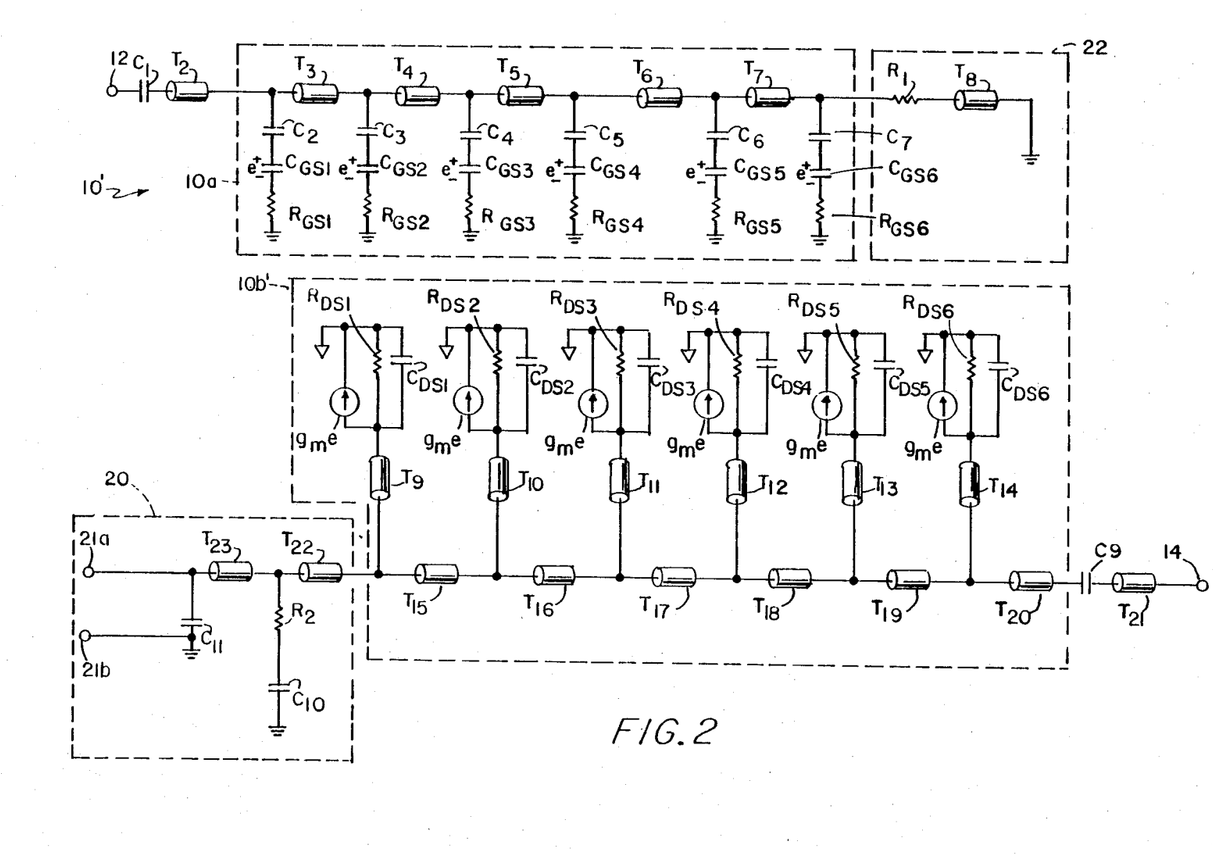
FIG. 2 is a schematic diagram of an equivalent circuit somewhat simplified of the distributed amplifier of FIG. 1.

Referring now to FIG. 2, it is noted that the equivalent circuit 10' of the distributed amplifier 10 (FIG. 1) includes the coupling capacitors $C_2-C_7$, the inherent capacitance between the gate and source electrodes of each of the field effect transistors FET 1-FET 6 as represented by capacitors $C_{GS1}-C_{GS6}$, and also includes an inherent gate resistance as represented by resistors $R_{G1}-R_{G6}$, respectively. Also included are the drain resistances $R_{D1}-R_{D6}$ of such transistors FET 1-FET 6, respectively, and the inherent drain to source capacitance $C_{DS1}-C_{DS6}$, respectively, of such transistors. It is noted that each field effect transistor includes in the equivalent circuit thereof, a current source which produces a current $g_m e$ where $g_m$ is the transconductance of such transistor and e is the voltage across the source to drain capacitance $C_{GS}$ of such transistor, as indicated. It is further to be noted that e, the voltage across the gate to source capacitance $C_{GS}$, is the voltage determined by the potential divider provided by the coupling capacitors $C_2-C_7$, and the inherent capacitance $C_{GS1}-C_{GS6}$ for each gate electrode $G_1-G_6$, respectively.

The characteristic impedance of the transmission lines $T_2-T_7$ are selected in accordance with the gate to source capacitance $C_{GS1}-C_{GS6}$, and the coupling capacitors $C_2-C_7$ to provide a ladder network 10a' having an input impedance matched to the characteristic impedance of the signal source 15 and transmission line $T_1$. It is noted that network 10a' includes the microstrip transmission lines $T_{21}-T_{26}$ and provides a predetermined characteristic impedance as discussed in my copending patent application Ser. No. 484,087 filed Apr. 11, 1983 and assigned to the same assignee as the present invention and incorporated herein by reference. It is also to be noted that the impedance of network 10a' is also a function of the impedance of termination network 22 which is here required to be complex in order to provide optimum performance of the circuit over the operating bandwidth. The real portion of such complex impedance is provided in part by resistor $R_1$.

It is also noted that the impedance of transmission lines $T_9-T_{14}$ and $T_{15}-T_{19}$ are selected in accordance with the inherent capacitance $C_{DS1}-C_{DS6}$ to provide the distributed amplifier 10 with the network 10b' having a predetermined output impedance matched to that of the load 16 (FIG. 1) in a similar manner as described above.

Figure 3:
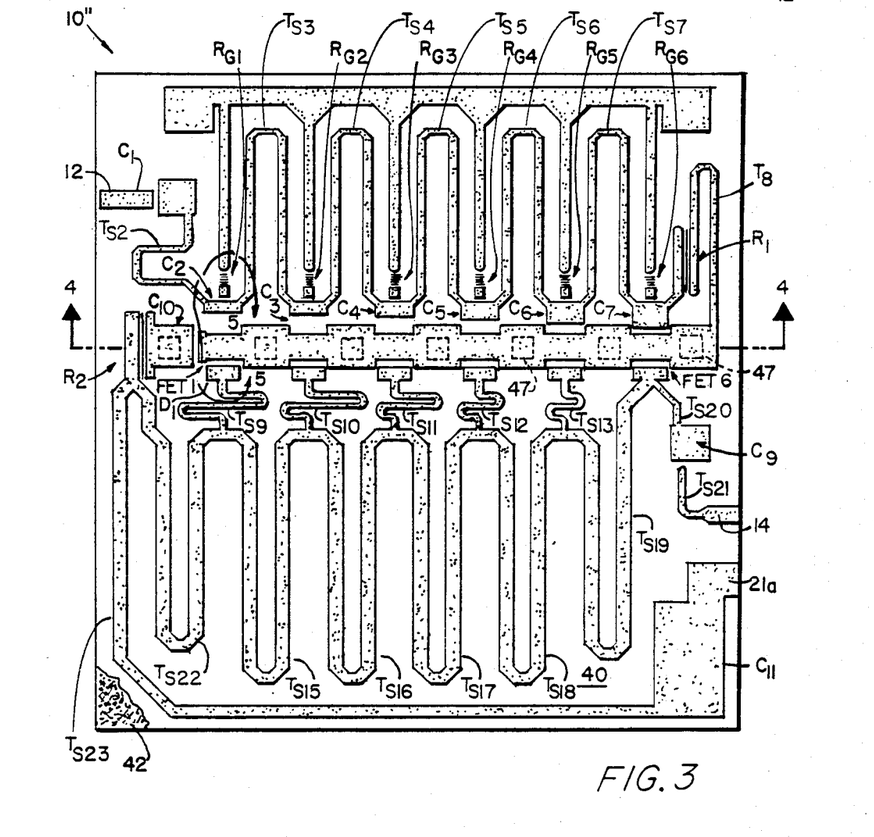
FIG. 3 is a plan view of a distributed amplifier of FIG. 1 fabricated as a monolithic integrated circuit.
Figure 4:
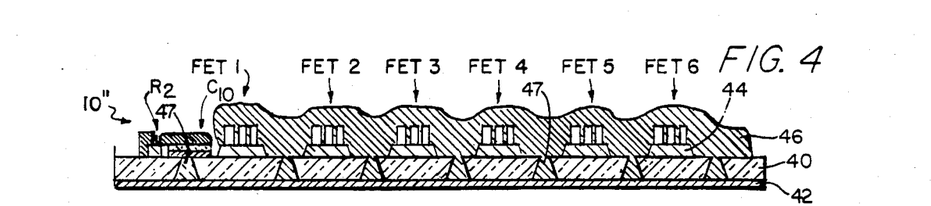
FIG. 4 is a cross-sectional view of the monolithic integrated circuit of FIG. 3, such cross-section being taken along line 4—4.
Figure 5:
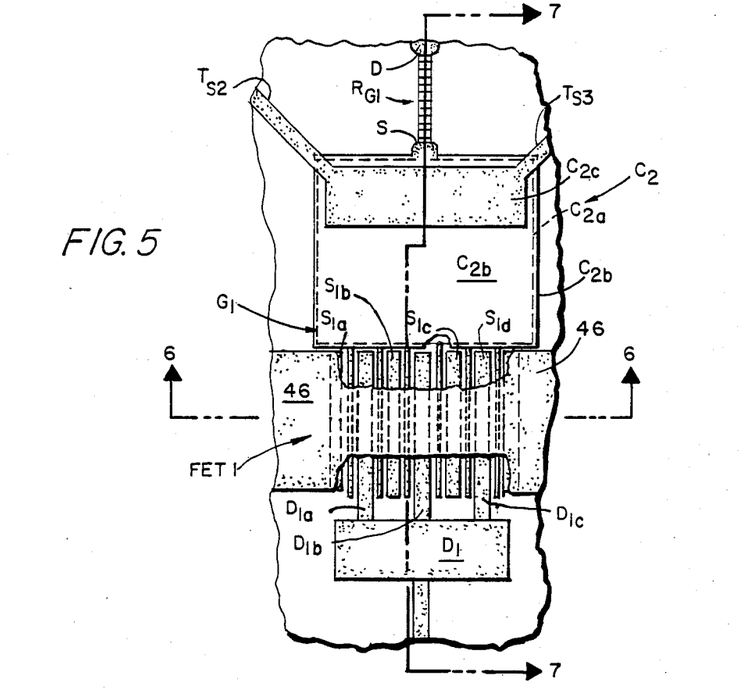
FIG. 5 is a plan view of a portion of the circuit of FIG. 1 showing a coupling capacitor and a field effect transistor.
Figures 6, 7:
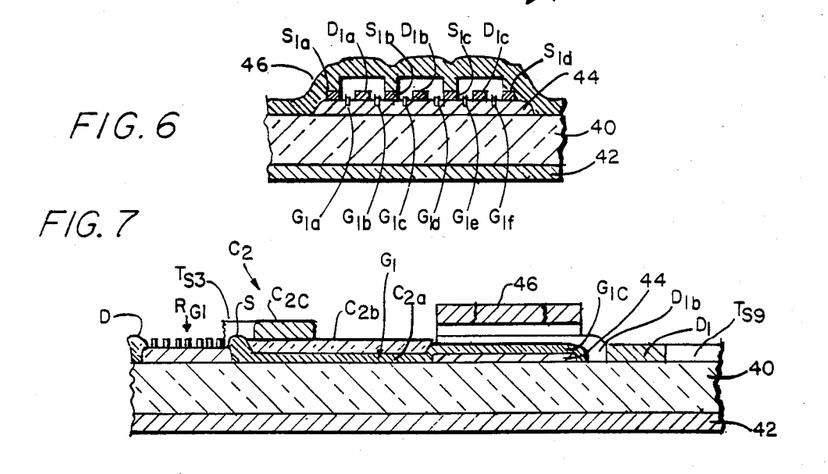
FIG. 6 is a cross-sectional view of FIG. 5 taken along line 6—6 showing the structure of the field effect transistor.
FIG. 7 is a cross-sectional view of FIG. 5 taken along line 7—7 showing the coupling capacitor interconnected to the transistor.

Referring now to FIGS. 3-7, the distributed power amplifier 10 (FIG. 6) is shown as a monolithic integrated circuit 10'', such amplifier 10'' being formed on a substrate 40 here of gallium arsenide having a ground plane conductor surface 42 formed on a bottom surface portion thereof and a mesa-shaped epitaxial layer 44 (FIGS. 4, 6, 7) formed on a portion of the upper surface of substrate 40, such surface being opposite to the surface of the ground plane conductor 42 and arranged to provide active regions for forming the field effect transistors FET 1-FET 6. Source electrodes of each one of the transistors FET 1-FET 6 are electrically connected to ground plane conductor 42 by plating through a via hole 47 provided in the substrate 40 and by providing a plated overlay 46 which interconnects each one of the source electrodes of each one of the field effect transistors FET 1-FET 6. Further, each one of the field effect transistors FET 1-FET 6 is identical in construction, each one thereof having a common drain electrode pad $D_1-D_6$, common gate pad $G_1-G_6$ and a common source overlay 46 connected to ground plane conductor 42 through vias 47, as shown. Thus, considering an exemplary one of such field effect transistors FET 1-FET 6, here FET 1, such transistor is shown in FIGS. 4-7 to have a common drain pad $D_1$ and spaced drain fingers $D_{1a}-D_{1c}$ with source contacts $S_{1a}-S_{1b}$ spaced from respective ones of the drain contacts $D_{1a}-D_{1c}$ by one of the gate electrodes $G_{1a}, G_{1f}$ as shown. The gate electrodes $G_{1a}, G_{1f}$ are connected together at a common gate contact, here and in FIG. 1 indicated by designation $G_1$. It is also noted that source contacts $S_{1a}-S_{1d}$ are electrically interconnected through the overlay conductor 46 passing over the field effect transistors FET 1 and remaining ones FET 2-FET 6, as shown in FIGS. 3, 4. The microstrip transmission lines $T_1-T_{24}$ are provided by patterned strip conductor portions $T_{s1}-T_{s24}$ which are spaced from the ground plane conductor 42 by a dielectric, here provided by the semi-insulating gallium arsenide substrate 40. A conductor 45 is formed on the substrate to provide gate bias to each one of the gate electrodes of field effect transistors FET 1-FET 6. The conductor is directly coupled to each one of the gate electrodes through resistors $R_{G1}-R_{G6}$, as shown. The resistors $R_{G1}-R_{G6}$ are here provided by open or floating gate MESFETS, as shown in FIG. 5 for resistor $R_{G1}$, to provide a relatively high resistance ($\approx 2$ K ohms), with drain and source electrodes D, S providing ohmic terminal contacts for the MESFET arranged as the resistor $R_{G1}$. Further, as shown in FIGS. 5, 7, coupling capacitors $C_2-C_7$, here coupling capacitor $C_2$ includes a first electrode $C_{2a}$ disposed on the semi-insulating substrate 40. Disposed over the first electrode $C_{2a}$ is a suitable dielectric $C_{2b}$. A second electrode contact $C_{2c}$ is provided over a portion of the dielectric. The second contact $C_{2c}$ is electrically connected to strip conductors $T_{S2}, T_{S3}$ of transmission lines $T_2, T_3$, as shown. The bottom contact $C_{2a}$ of the capacitor $C_2$ is coupled to one of the aforementioned contacts of the resistor $R_{G1}$, as shown, and is coupled to the gate electrode fingers $G_{1a}-G_{1f}$ of field effect transistor FET 1, as shown, and therefore contact $C_{2a}$ forms the aforementioned gate contact $G_1$ of the field effect transistor FET 1. Thus, input terminal 12 is coupled to the first conductive pad $C_{2c}$ of capacitor $C_2$ by strip conductor $T_{s2}$ of microstrip transmission line $T_2$ and is also connected to strip conductor $T_{s3}$ of microstrip transmission line $T_3$. Similarly, gate contacts $G_2-G_6$ corresponding to bottom contacts (not shown) of capacitors $C_3-C_7$ are interconnected to strip conductors corresponding to strip conductors $T_{s3}-T_{s7}$ of microstrip transmission lines $T_3-T_7$. The strip conductors $T_{s9}-T_{s14}$ of transmission lines $T_9-T_{14}$ are shown to interconnect the drain electrodes $D_1-D_6$ of FET 1-FET 6 to the output transmission line comprising transmission line sections $T_{15}-T_{20}$ having strip conductor portions $T_{s15}-T_{s20}$. It is to be noted that each strip conductor portion $T_{s9}-T_{s13}$ of the corresponding transmission lines $T_9-T_{13}$ has a predetermined length. The predetermined length of each strip conductor $T_{s9}-T_{s14}$ is selected to provide phase compensation to signals propagating through the field effect transistors FET 1-FET 6. It is also noted that in the embodiment shown in FIG. 3, the length of transmission line $T_{14}$ (FIG. 1) is substantially equal to zero, thus $T_{s14}$ is not shown in FIG. 3, but in general $T_{s14}$ would be required. Since the input signal propagating along transmission lines $T_2-T_7$ is capacitively coupled through capacitors $C_2$–$C_7$ to respective gate electrodes $G_1$–$G_6$, the phase of each signal is a function, in part, of the capacitance of each coupling capacitor $C_2$–$C_7$. Therefore, in order to maintain the proper phase relationship at junction 28f between each signal coupled through drain electrodes $D_1$–$D_6$, the electrical pathlength of transmission lines $T_9$–$T_{14}$ is adjusted to provide the requisite phase compensation to the signal coupled from each drain electrode $D_1$–$D_6$.

As previously mentioned, the maximum output power provided from the distributed amplifier may be considered as being limited by three constraints.

Accordingly, the input signal is coupled from the input terminal 12 of the distributed amplifier 10 and propagates along the input gate line comprising transmission line sections $T_2$–$T_7$. A selective portion of such signal is coupled to the gate electrodes $G_1$–$G_6$ of each one of the corresponding field effect transistors FET 1–FET 6. The amplitude of the voltage of such signal which is coupled to the corresponding drain electrodes, however, is selected in accordance with the predetermined capacitance ratio of the coupling capacitors $C_2$–$C_7$ in combination with the reactive capacitance $C_{GS1}$–$C_{GS6}$ between gate and source electrodes of each one of the field effect transistors FET 1–FET 6. By properly selecting the value of capacitance for capacitors $C_2$–$C_7$, that is, by controlling the surface area of plates $C_{2c}$–$C_{6c}$, in accordance with the maximum input signal provided to each one of the field effect transistors and the attenuation of the input signal along the gate line, it is possible to increase the maximum input power handling capability of the circuit while providing, if desired, uniform input signal excitation to each one of the field effect transistors FET 1–FET 6, as described above. In this manner, the input power to the amplifier can be significantly increased. To maintain the same gain per stage, the total gate periphery of each field effect transistor is increased accordingly. This results in a concomitant increase in output power. Further, by providing uniform excitation, increased output power with increased gain and efficiency is provided.

Figure 8:
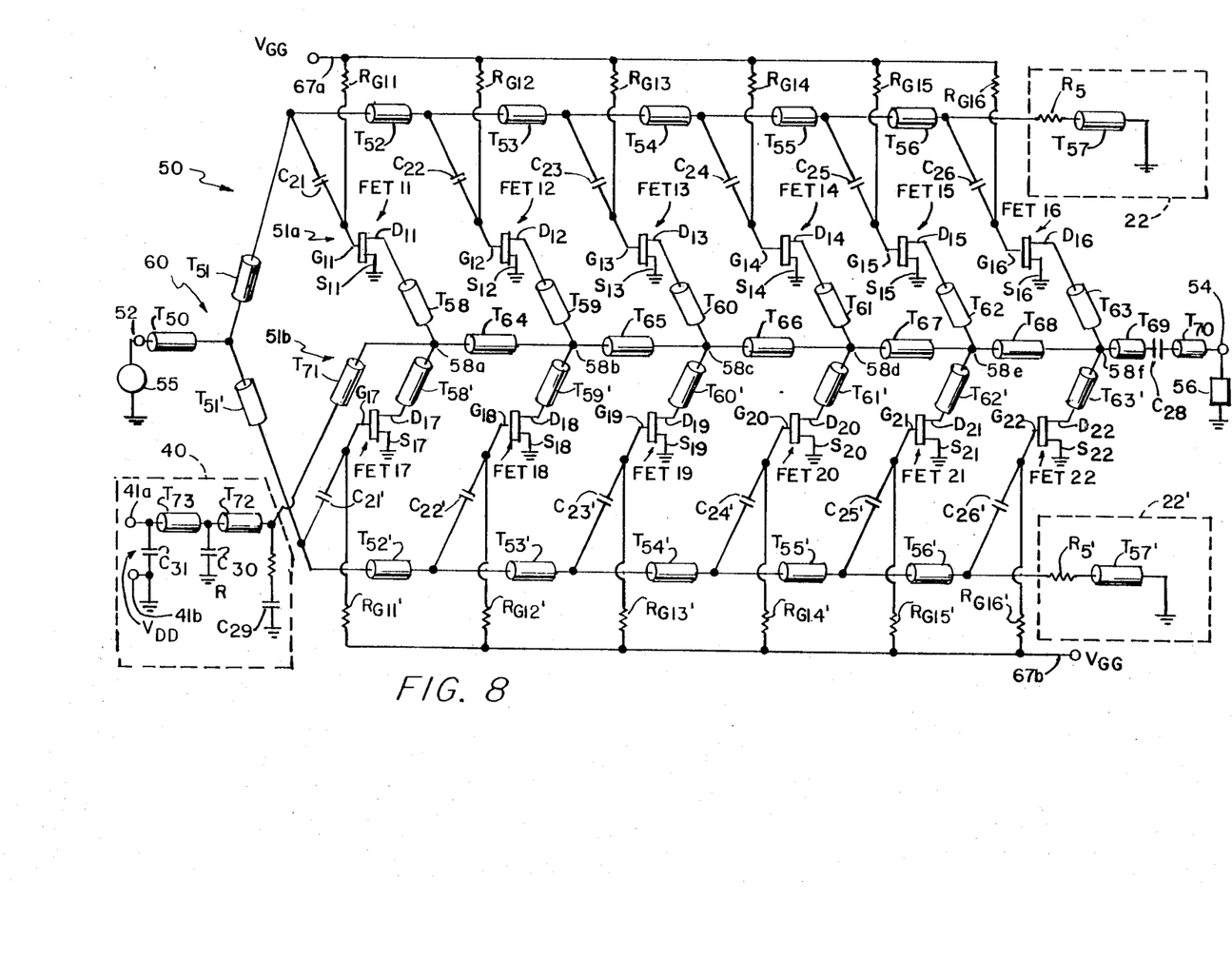
FIG. 8 is a schematic diagram of an alternate embodiment of the present invention.

Referring now to FIG. 8, an alternate embodiment of a distributed power amplifier 50 is shown to include a plurality of channels, here two channels, channels 51a, 51b, with each channel 51a, 51b being interconnected between an input r.f. terminal 52 and an output r.f. terminal 54 to provide amplification of radio frequency signals fed to the input terminal 52 from a signal source 55 via transmission line $T_{50}$, here a microstrip transmission line, such amplified radio frequency signals appearing at the output terminal 54 and being fed to a load 56. Each one of the plurality of channels 51a, 51b includes a plurality of here six field effect transistors, with FET 11–FET 16 being associated with channel 51a and FET 17–FET 22 being associated with channel 51b.

The field effect transistors FET 11–FET 22 are here metal electrode semiconductor field effect transistors as described in conjunction with FIG. 1. Field effect transistors FET 11–FET 16 here forming the first stage 51a have input electrodes, here gate electrodes $G_{11}$–$G_{16}$, respectively, cascade electrically interconnected via transmission lines, here microstrip transmission lines $T_{52}$–$T_{56}$ and coupling capacitors $C_{21}$–$C_{26}$, respectively, as shown. The output electrodes, here drain electrodes $D_{11}$–$D_{16}$ of field effect transistors FET 11–FET 16, respectively, are cascade electrically interconnected via transmission lines, here microstrip transmission lines $T_{58}$–$T_{63}$ and $T_{64}$–$T_{68}$, as shown. Source electrodes $S_{11}$–$S_{16}$ of the transistors FET 11–FET 16, respectively, are coupled to a reference potential, here ground through a common radio frequency and DC electrical path, as shown. Each gate electrode $G_{11}$–$G_{16}$ is connected to a DC bias line 67a via a corresponding one of a plurality of resistors, here resistors $R_{G11}$–$R_{G16}$.

In a similar manner, a second channel 51b of the dual stage distributed amplifier 50 includes field effect transistors FET 17–FET 22. Similarly, the gate electrodes, here gate electrodes $G_{17}$–$G_{22}$ are cascade electrically coupled together by transmission line sections $T_{52}'$–$T_{56}'$ and coupling capacitors $C_{21}'$–$C_{26}'$. The output electrodes, here drain electrodes $D_{17}$–$D_{22}$ are cascade electrically interconnected via transmission lines $T_{58}'$–$T_{63}'$ and the transmission lines $T_{64}'$–$T_{68}'$. Thus, as shown in FIG. 11, the drain electrodes $D_{17}$–$D_{22}$ are coupled to a common serially cascade interconnected microstrip transmission line comprising microstrip transmission line sections $T_{64}$–$T_{68}$. As also shown, the drain electrodes $D_{11}$–$D_{16}$ and $D_{17}$–$D_{22}$ are preferably coupled to the transmission lines at common junctions 58a–58d, as shown. That is, drain electrodes $D_{11}$ and $D_{17}$ are coupled to transmission line $T_{64}$ at common junction 58a and a succeeding one of the pairs of such drain electrodes $D_{12}$–$D_{16}$ and $D_{18}$–$D_{22}$ are coupled with succeeding ones of transmission lines $T_{65}$–$T_{68}$ at corresponding common junctions 58b–58f. Source electrodes of transistors FET 11–FET 22 are coupled to a common reference potential, here ground, through a common r.f. and DC electrical path, as shown. The gate electrodes $G_{17}$–$G_{22}$ are also coupled via resistors $R_{G17}$–$R_{G22}$ to a common DC bias line 67b which is preferably coupled to bias line 67a.

Drain bias circuit 40 is here a ladder network having three shunt paths to ground via capacitors $C_{29}$, $C_{30}$ and $C_{31}$ with transmission lines, here microstrip transmission lines $T_{71}$, $T_{72}$ and $T_{73}$ providing series elements of such ladder network. Input terminals 41a, 41b are adapted for coupling to a drain electrode DC bias source such as $V_{DD}$ as described in conjunction with FIG. 1.

The amplifier 50 further includes a pair of gate termination circuits 22, 22'. Here gate line termination circuit 22 being representative also of gate line termination circuit 22' includes serially connected resistor $R_5$, serially coupled microstrip transmission line $T_{57}$ and a capacitor $C_{27}$, as shown.

The drain transmission line $T_{64}$–$T_{68}$ is terminated in a complex impedance including serially connected transmission line $T_{69}$, DC blocking capacitor $C_{28}$ and serially connected transmission line $T_{70}$ which is coupled to the output electrode 54, as shown.

In operation, an r.f. input signal from r.f. source 55 is fed to input terminal 52, and is coupled to transmission line $T_{50}$. Transmission lines $T_{51}$, $T_{51}'$ and $T_{50}$ provide in combination a balanced power divider network 60 as described in my copending patent application Ser. No. 484,087 filed Apr. 11, 1983 and assigned to the same assignee as the present invention. A pair of signals having substantially the same phase and amplitude propagate through channels 51a, 51b via transmission lines $T_{52}$–$T_{56}$ or $T_{52}'$–$T_{56}'$. The signal which propagates through transmission lines $T_{51}$ to $T_{56}$ is coupled through corresponding ones of capacitors $C_{21}$–$C_{26}$ to corresponding gate electrodes $G_{11}$–$G_{16}$ of FET 11–FET 16 which are biased to provide gain to such signals. The amplified signal from FET 11 is coupled from drain $D_{11}$ to transmission line $T_{58}$ and is fed to junction 58a and propagates along transmission lines $T_{64}$–$T_{68}$ to junction 58f. The amplified signal from FET 12 is coupled to transmission line $T_{59}$ and to junction 58b and propagates along transmission lines $T_{65}$–$T_{68}$ and is combined in phase at junction 58f with the previous signal coupled from FET 11. Similarly, succeeding ones of such transistors FET 13–FET 16 each feed an amplified radio frequency signal at a succeeding one of said junctions 58c–58f and each one of said signals is combined in phase at junction 58f with the signals fed from previous ones of said FETS. The total composite signal is then coupled to the output terminal 54.

The input signal coupled from radio frequency source 55 to transmission line $T_{51}'$ is coupled to gate electrodes $G_{17}$–$G_{22}$ through capacitors $C_{21}$–$C_{26}$, as mentioned above. Capacitors $C_{21}$–$C_{26}$ in combination with the inherent input capacitance provided between gate and source electrodes of FET 11–FET 16 provide a potential or voltage divider to such r.f. energy. By providing the capacitors $C_{21}$–$C_{26}$, input power handling capability of the amplifier is increased. Preferably, by choosing the value of capacitance of each capacitor to provide selected, different coupling ratios of voltage to each FET, FET 11–FET 22, uniform excitation of each FET is provided resulting in increased power handling capability, gain and efficiency.

In a similar manner, the signal which propagates through transmission lines $T_{51}'$–$T_{56}'$ is coupled via capacitors $C_{21}'$–$C_{26}'$ to corresponding gate electrodes $G_{17}$–$G_{22}$ of FET 17–FET 22 and output signals are coupled at junctions 58a–58f with corresponding signals from FET 11–FET 16, as described in my copending patent application Ser. No. 484,087 filed Apr. 11, 1983 and assigned to the same assignee as the present invention.

It is to be noted that the electrical pathlengths between the input terminal 52 and the output terminal 54 through each one of the field effect transistors FET 11–FET 22 are substantially equal. That is, the lengths of the transmission line sections $T_{51}$–$T_{56}$, $T_{51}'$–$T_{56}'$, $T_{58}$–$T_{63}$, $T_{58}'$–$T_{63}'$ and $T_{64}$–$T_{68}$, which interconnect the field effect transistors FET 11–FET 22, and the phase or delay characteristics of FET 11–FET 22 are selected in combination to provide such equal electrical pathlengths. It is also to be noted that the coupling capacitors $C_{21}$–$C_{26}$ and $C_{21}'$–$C_{26}'$ having a selected capacitive reactance in combination with the fixed reactance of the field effect transistors between the source and gate electrodes provide in combination selected phase delay characteristics to each one of the field effect transistors FET 11–FET 22. Therefore, in order to provide equal electrical pathlengths between the input terminal 52 and the output terminal 54 to each one of said field effect transistors, the electrical pathlength of transmission line sections $T_{58}$–$T_{63}$ and $T_{58}'$–$T_{63}'$ is adjusted accordingly as described in conjunction with FIG. 1.

Accordingly, a signal fed to the power divider 60 is split substantially equally between transmission lines $T_{51}$ and $T_{51}'$. The characteristic impedance of transmission line $T_{50}$ in combination with transmission line $T_{51}$ and transmission lines $T_{52}$–$T_{56}$ provide the same input impedance as transmission line $T_{50}$ in combination with transmission line $T_{51}'$ and transmission lines $T_{52}'$–$T_{56}'$. Therefore, the input power fed to each of the gate electrodes $G_{11}$–$G_{16}$ of the FETS of the first channel 51a substantially equals the input power fed to the gate electrodes $G_{17}$–$G_{22}$ of the FETS of the second channel 51b. Therefore, by maintaining the same input power for each channel 51a, 51b of the distributed amplifier 50, the maximum input power which can be fed to the distributed amplifier 50 is increased by a factor of two, compared to the maximum input power fed to a conventional distributed amplifier. Further, since each gate electrode $G_{11}$ to $G_{16}$ is coupled to the respective transmission lines $T_{52}$ to $T_{56}$ and $T_{52}'$ to $T_{56}'$ through a capacitor, a voltage divider is provided which increases the input power handling capability of each FET as discussed in conjunction with FIG. 1.

Further, the total gate periphery of the distributed amplifier is increased by a factor of two in comparison to that of a conventional distributed amplifier. Since the total gate periphery is divided between separate channels 51a, 51b of the distributed amplifier 50, the total gate periphery loading provided to the r.f. input signal fed to each one of the channels 51a, 51b is equal to the total gate periphery loading of a conventional single channel distributed amplifier. Therefore, since the drain electrodes $D_{11}$–$D_{22}$ of FET 11–FET 12 are coupled to a common drain transmission line comprised of transmission lines $T_{64}$–$T_{68}$, FET 11 to FET 22 coupled r.f. energy in response to signals fed to two separate gate lines, thus providing output power equivalent to twice the gate periphery of a conventional single channel distributed amplifier. However, the gate periphery of each transistor can also be increased without loading the gate transmission line as described in conjunction with FIG. 1.

Further, since the drain electrodes $D_{11}$–$D_{22}$ of FET 11–FET 22 provide output power to a common transmission line comprised of transmission lines $T_{64}$–$T_{68}$, and since corresponding pairs of such drain electrodes are electrically connected together at a corresponding one of common junctions 58a–58f, the effective drain periphery coupled to the output line is doubled and the FETS are effectively connected in parallel. Further still, since the gate periphery of each transistor is increased, then the total drain periphery of each transistor is also increased. Thus, the optimum output impedance of a field effect transistor biased for maximum gain is reduced by a factor related to the effective increase in drain periphery by connecting the field effect transistors in parallel and also by the actual increase in the drain periphery of each FET. Therefore, the optimum output impedance of each FET is closer to the actual loadline impedance provided by such FETS, where such actual loadline impedance is predetermined by the output impedance of the distributed amplifier.

Further, preferably, the value of capacitance for each capacitor $C_{21}$–$C_{26}$, $C_{21}'$–$C_{26}'$ is selected in accordance with the fixed inherent capacitance of each FET such that each FET is fed a uniform input signal, that is, a predetermined, different tailored portion of the input signal on the gate lines $T_{51}$–$T_{56}$ and $T_{51}'$–$T_{56}'$ is selectively sampled by each FET. In this manner, the input power to the amplifier 50 can be significantly increased and the total gate periphery can be increased, as described in conjunction with FIG. 1. Therefore, by providing channels 51a, 51b and the coupling capacitors $C_{21}$–$C_{26}$ and $C_{21}'$–$C_{26}'$, the input power handling capability of the distributed amplifier 50 is increased and the gate periphery of each transistor as well as the drain periphery and effective drain periphery of each transistor is increased, as described above. Further, with uniform excitation to each transistor, improvements in gain, efficiency and output power are provided.

Having described preferred embodiments of this invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A distributed amplifier having an input terminal and an output terminal comprising:
   a plurality of successively coupled transistors, each one thereof having an input electrode and an output electrode;
   first means including a plurality of capacitors for capacitively coupling each one of the input electrodes of the plurality of transistors to the input terminal; and
   second means for cascade interconnecting the output electrode of each transistor having a first end coupled to the output terminal.

2. The distributed amplifier as recited in claim 1 wherein the coupling means further includes a transmission line and wherein each capacitor is coupled between said transmission line and the corresponding one of the input electrodes of the transistors.

3. The distributed amplifier as recited in claim 1 wherein each transistor further comprises:
   a reference electrode;
   a reactive component between the input electrode and the reference electrode;
   wherein an input radio frequency signal is fed to the input terminal; and
   wherein the value of capacitance for each one of said plurality of capacitors is selected in accordance with the value of the reactive component of each transistor to provide a predetermined portion of the input radio frequency signal to said transistors.

4. The distributed amplifier as recited in claim 3 wherein the value of capacitance for each of said capacitors is selected to provide substantially uniform predetermined portions of the input radio frequency signal.

5. The distributed amplifier as recited in claim 1 wherein the transistors further comprise:
   a reference electrode; and
   a reactive component between the input electrode and the reference electrode of each transistor; and
   wherein the first means has an impedance in accordance with the impedance of the reactive element between each input electrode and the grounded electrode and the reactance of the corresponding capacitor to provide the amplifier with a predetermined input impedance.

6. The distributed amplifier as recited in claim 1 wherein the output coupling means further comprises:
   a common transmission line; and
   a plurality of transmission lines coupled between a corresponding one of the output electrodes and the common transmission line, each one of said plurality of transmission lines having a selected electrical length in accordance with the corresponding one of such capacitors to provide between each input terminal and the output terminal equal electrical pathlengths through each one of the transistors.

7. A distributed amplifier having an input terminal and an output terminal comprising:
   a first plurality of successively coupled transistors, each one thereof having an input electrode and an output electrode;
   first means, including a first plurality of capacitors, for capacitively coupling each one of said input electrodes of the first plurality of transistors to the input terminal;
   a second plurality of successively coupled transistors, each one thereof having an input electrode and an output electrode;
   second means, including a second plurality of capacitors, for capacitively coupling each of said input electrodes of the second plurality of transistors to the input terminal; and
   a common means for electrically interconnecting the output electrode of each one of said transistors to the output terminal.

8. The distributed amplifier as recited in claim 7 wherein the output electrode of each one of the first plurality of transistors is coupled at a corresponding one of a plurality of common junctions of said common means with the output electrode of each one of the second plurality of transistors.

9. The distributed amplifier as recited in claim 7 wherein the first and second coupling means each further comprise a transmission line and wherein each capacitor is coupled between said transmission line and a corresponding one of input electrodes of the transistor.

10. The distributed amplifier as recited in claim 7 wherein each transistor includes:
   a reference electrode;
   a reactive component between the input electrode and reference electrode;
   wherein an input radio frequency signal is fed to the input terminal; and
   wherein the value of capacitance for each one of each plurality of capacitors is selected in accordance with the value of the reactive component of each transistor to provide predetermined portions of the input radio frequency signal to said transistors.

11. The distributed amplifier as recited in claim 10 wherein the value of capacitance for each of said capacitors is selected to provide substantially uniform predetermined portions of the input radio frequency signal.

12. The distributed amplifier as recited in claim 10 wherein the transistors further comprise:
   a reference electrode;
   a reactive component between the input electrode and reference electrode of each transistor; and
   wherein each of said first and second means has an impedance in accordance with the impedance of the reactive element between each corresponding input electrode and reference electrode and the impedance of the corresponding coupling capacitor to provide the amplifier with a predetermined input impedance.

13. The distributed amplifier as recited in claim 12 wherein each transistor further includes a reactive element between the output electrode and reference electrode; and
   wherein the common means includes a common transmission line having a characteristic impedance in accordance with the impedance of the reactive element between the output and reference electrode of each transistor to provide the combination with a predetermined output impedance.

14. The distributed amplifier as recited in claim 13 further comprising a plurality of transmission lines, each one coupled between a corresponding one of the output electrodes and the common transmission line, each one of said plurality of transmission lines having a selected electrical length in accordance with the corresponding one of the capacitors to provide between each input terminal of the distributed amplifier and the output terminal of the distributed amplifier equal electrical pathlengths through each one of the transistors.

15. A distributed amplifier having an input terminal and an output terminal comprising:
a first plurality of successively coupled field effect transistors with cascaded gate electrodes, cascaded drain electrodes, a first one of such field effect transistors having the gate electrode thereof coupled to the input terminal, such terminal being adapted to receive an input radio frequency signal, and the last one of the successively coupled field effect transistors having the drain electrode thereof coupled to an output terminal, said output terminal being adapted to provide an amplified output radio frequency signal;
first means, coupled to each one of the gate electrodes of the first plurality of field effect transistors, for providing separate bias and radio frequency signal paths;
a second like plurality of successively coupled field effect transistors with cascaded gate electrodes, cascaded drain electrodes, a first one of such field effect transistors having the gate electrode thereof coupled to the input terminal and the last one of the successively coupled field effect transistors having the drain electrode thereof coupled to the output terminal;
second means, coupled to each one of the gate electrodes of the second plurality of field effect transistors, for providing separate bias and radio frequency signal paths; and
common means, for electrically interconnecting the drain electrode of each one of the field effect transistors to the output terminal of the distributed amplifier.

16. The distributed amplifier as recited in claim 15 wherein electrical pathlengths between the input terminal and the output terminal through each one of the field effect transistors are substantially equal.

17. The distributed amplifier as recited in claim 15 wherein the first and second means each include a transmission line, a plurality of capacitors, with each capacitor being coupled between said transmission line and a corresponding one of gate electrodes of the field effect transistor to provide the radio frequency path; and
a like plurality of resistors, each one coupled between a common bias line and a corresponding one of said input electrodes.

18. The distributed amplifier as recited in claim 17 wherein each field effect transistor includes a reference electrode and a reactive component between the gate electrode and reference electrode; and
wherein the value of capacitance for each one of said plurality of capacitors is selected in accordance with the value of the reactive component of each field effect transistor to provide predetermined radio frequency input signals to said field effect transistors.

19. The distributed amplifier as recited in claim 16 wherein the field effect transistors further comprise a reference electrode and a reactive component between the gate electrode and reference electrode of each field effect transistor; and
wherein each one of the first and second means comprise a transmission line and a plurality of capacitors, with each capacitor being coupled between said transmission line and a corresponding one of said gate electrodes of the field effect transistors, and wherein said transmission line has an impedance in accordance with the impedance of the reactive element between each gate electrode and reference electrode and the impedance of the corresponding capacitor to provide the distributed amplifier with a predetermined input impedance.

20. The distributed amplifier as recited in claim 19 wherein each field effect transistor includes a reactive element between the drain electrode and the reference electrode and wherein the coupling means includes a common transmission line having a characteristic impedance in accordance with the impedance of the reactive element between drain and reference electrodes of each field effect transistor to provide the distributed amplifier with a predetermined output impedance.

21. The distributed amplifier as recited in claim 19 further comprising a plurality of transmission lines coupled between a corresponding one of the output electrodes and the common transmission line, each one of said plurality of transmission lines having a selected electrical length in accordance with a corresponding one of such capacitors to provide between each input terminal and the output terminal equal electrical pathlengths through each one of the field effect transistors.

* * * * *

Notice of Adverse Decisions in Interference

In Interference No. 101,620, involving Patent No. 4,543,535, Y. Ayasli, DISTRIBUTED POWER AMPLIFIER, final judgment adverse to the patentee was rendered June 6, 1989, as to claims 1-21.
*(Official Gazette February 20, 1990)*